US010868554B1

(12) United States Patent
Reitsma et al.

(10) Patent No.: US 10,868,554 B1
(45) Date of Patent: Dec. 15, 2020

(54) TIME-EFFICIENT OFFSET CANCELLATION FOR MULTI-STAGE CONVERTERS (71) Applicant: Analog Devices International Unlimited Company, Limerick (IE)

(72) Inventors: George Pieter Reitsma, Redwood City, CA (US); Raymond Thomas Perry, South San Francisco, CA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/706,230

(22) Filed: Dec. 6, 2019

(51) Int. Cl.
*H03M 1/12* (2006.01)
*H03M 1/06* (2006.01)
*H03M 3/00* (2006.01)

(52) U.S. Cl.
CPC ......... *H03M 1/0607* (2013.01); *H03M 3/356* (2013.01)

(58) Field of Classification Search
CPC ...... H03M 1/0607; H03M 3/356; H03M 1/06; H03M 1/207; H03M 1/12
USPC ................................................. 341/118, 155
See application file for complete search history.

(56) References Cited

U.S. PATENT DOCUMENTS

| | | | |
|---|---|---|---|
| 6,289,070 B1 | 9/2001 | Krone et al. | |
| 6,396,429 B2* | 5/2002 | Singer ................. | H03M 1/1245 341/155 |
| 7,339,512 B2* | 3/2008 | Gulati .................. | H03M 1/168 341/122 |
| 7,821,436 B2* | 10/2010 | Teeka Srinvasa Setty ................. | H03M 1/0641 341/121 |
| 7,889,111 B2* | 2/2011 | Kawahito ............. | H03M 1/144 341/162 |
| 8,284,090 B2 | 10/2012 | Maurino | |
| 8,659,461 B1 | 2/2014 | Zhu et al. | |
| 8,723,706 B1 | 5/2014 | Shin et al. | |
| 8,779,963 B1* | 7/2014 | Bales ................... | H03M 1/007 341/161 |
| 8,884,801 B1 | 11/2014 | Ranjbar | |
| 8,957,794 B2 | 2/2015 | Verbruggen et al. | |
| 9,455,737 B1 | 9/2016 | Rajaee et al. | |
| 9,503,119 B2* | 11/2016 | Coulon ............... | H03F 3/45565 |
| 9,660,660 B1 | 5/2017 | Beukema et al. | |
| 9,660,662 B2 | 5/2017 | Venca et al. | |
| 10,284,145 B2 | 5/2019 | Sun et al. | |
| 10,608,655 B1* | 3/2020 | Li ....................... | H03M 1/1009 |

(Continued)

FOREIGN PATENT DOCUMENTS

| | | |
|---|---|---|
| CN | 104426549 A | 3/2015 |
| EP | 3043478 A1 | 7/2016 |

OTHER PUBLICATIONS

Lee, Minjae, et al., "A9 b, 1.25 ps Resolution Coarse—Fine Time-to-Digital Converter in 90 nm CMOS that Amplifies a Time Residue", IEEE Journal of Solid-State Circuits, 43(4), (Apr. 2008), 9 pgs.

(Continued)

*Primary Examiner* — Jean B Jeanglaude
(74) *Attorney, Agent, or Firm* — Schwegman Lundberg & Woessner, P. A.

(57) ABSTRACT

Techniques to reduce the on-time of a multi-stage ADC circuit by combining the settling time of a signal conditioning circuit, e.g., buffer circuit, and the setting time of a residue amplifier when cancelling the offset of the signal conditioning circuit. The techniques can allow the signal conditioning circuit and the residue amplifier to settle together.

20 Claims, 4 Drawing Sheets

(56) References Cited

U.S. PATENT DOCUMENTS

| | | | |
|---|---|---|---|
| 2001/0052869 A1* | 12/2001 | Singer | H03M 1/1245 |
| | | | 341/156 |
| 2010/0156692 A1 | 6/2010 | Jeon et al. | |
| 2011/0001647 A1* | 1/2011 | Veeder | H03M 1/164 |
| | | | 341/146 |
| 2011/0187573 A1* | 8/2011 | Thomas | H03F 3/211 |
| | | | 341/155 |
| 2015/0349795 A1* | 12/2015 | Coulon | H03F 3/45565 |
| | | | 341/122 |
| 2019/0190531 A1 | 6/2019 | Martens et al. | |
| 2019/0305790 A1* | 10/2019 | Kinyua | H03M 1/0612 |

OTHER PUBLICATIONS

Liu, Zhaozhe, et al., "An Offset Calibration Technique in a SAR ADC for Biomedical Applications", 12th IEEE Intl. Conference on Anti-counterfeiting, Security, and Identification (ASID), (2018), 4 pgs.

Sarkar, Sudipta, et al., "An 8b 1.39GS/s 0.85V Two-Step ADC with Background Comparator Offset Calibration", IEEE 60th Intl. Midwest Symposium on Circuits and Systems (MWSCAS), (2017), 4 pgs.

Verbruggen, Bob, et al., "A 1.7 mW 11b 250 MS/s 2-Times Interleaved Fully Dynamic Pipelined SAR ADC in 40 nm Digital CMOS", IEEE Journal of Solid-State Circuits, 47(12), (Dec. 2012), 8 pgs.

Verbruggen, Bob, et al., "A 2.1 mW 11b 410 MS/s Dynamic Pipelined SAR ADC with Background Calibration in 28nm Digital CMOS", IEEE Symposium on VLSI Circuits, (2013), 2 pgs.

Wang, Guanhua, et al., "A 43.6-dB SNDR 1-Gs/s Single-Channel SAR ADC using Coarse and Fine Comparators with Background Comparator Offset Calibration", 43rd IEEE European Solid State Circuits Conference, (2017), 4 pgs.

* cited by examiner

TIME-EFFICIENT OFFSET CANCELLATION FOR MULTI-STAGE CONVERTERS

FIELD OF THE DISCLOSURE

This document pertains generally to analog-to-digital converters.

BACKGROUND

In many electronics applications, an analog input signal is converted to a digital output signal (e.g., for further digital signal processing). For instance, in precision measurement systems, electronics are provided with one or more sensors to make measurements, and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

SUMMARY OF THE DISCLOSURE

This disclosure is directed to, among other things, techniques to reduce the on-time of a multi-stage ADC circuit by combining the settling time of a signal conditioning circuit, e.g., buffer circuit, and the setting time of a residue amplifier when cancelling the offset of the signal conditioning circuit. The techniques of this disclosure can allow the signal conditioning circuit and the residue amplifier to settle together.

In some aspects, this disclosure is directed to a method of canceling an offset of a signal conditioning circuit coupled to an input of a multi-stage analog-to-digital converter (ADC) circuit. The method comprises sampling an analog input signal and the offset; performing, by a first stage of the ADC circuit, a first conversion on the sampled analog input signal and offset; canceling the offset and amplifying a residue of the sampled analog input signal; performing, by a second stage of the ADC circuit, a second conversion on the residue of the sampled analog input signal; and generating a digital output signal representing the sampled analog input signal.

In some aspects, this disclosure is directed to a multi-stage analog-to-digital converter (ADC) circuit having an input coupled to a signal conditioning circuit having an offset. The ADC circuit comprises a sample-and-hold circuit configured to sample an analog input signal and the offset; a first stage including a first ADC sub-circuit configured to perform a first conversion on the sampled analog input signal and offset; a control circuit configured to operate a plurality of switches to generate the residue of the first conversion and eliminate the signal conditioning circuit offset from the residue; a residue amplifier configured to amplify a residue of the sampled analog input signal; a second stage including a second ADC sub-circuit configured to perform a second conversion on the residue of the sampled analog input signal; and an encoder circuit configured to combine first and second conversion results and generate a digital output signal representing the sampled analog input signal.

In some aspects, this disclosure is directed to a multi-stage analog-to-digital converter (ADC) circuit having an input coupled to a signal conditioning circuit having an offset. The ADC circuit comprises a sample-and-hold circuit configured to sample an analog input signal and the offset; means for performing, by a first stage of the ADC circuit, a first conversion on the sampled analog input signal and offset; means for canceling the offset and amplifying a residue of the sampled analog input signal; means for performing, by a second stage of the ADC circuit, a second conversion on the residue of the sampled analog input signal; and means for generating a digital output signal representing the sampled analog input signal.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Multi-stage analog-to-digital converters can utilize a successive series of stages (or cycles of operation) each arranged to develop a digital output of limited scope, e.g., one or more bits, and to produce from each stage (or cycle of operation) an analog residue signal as the input for the next stage (or cycle), In this way, a high-resolution output can be developed by combining the digital outputs of the several stages or cycles.

Multi-stage ADC architectures can use inter-stage amplification, e.g., using a residue amplifier, particularly when the overall resolution exceeds about nine bits. Such amplification is for the purpose of raising the residue of one conversion to a level that can be digitized by the next subsequent stage.

Multi-stage ADC architectures can use various analog-to-digital converter (ADC) topologies, including delta-sigma, flash, and successive approximation register (SAR) data converters. One of the attractive characteristics of SAR data converters is their ability to scale power consumption with conversion rate. The data converter only requires power during a conversion and can be powered down between conversions. Hence, the shorter the duty cycle the converter is on, the less power is consumed.

Zero-drive data converters, e.g., converters that do not draw current from the input, can incorporate a buffer amplifier at the input, such that they can be driven by sources with a high impedance. Zero-drive converters can include buffer circuits, e.g., buffer amplifiers, or other signal conditioning circuitry, e.g., instrumentation amplifiers, transimpedance amplifiers, and filters, coupled to their inputs. To eliminate offset and 1/f noise generated by the signal conditioning circuitry, it can be chopped or auto-zeroed, for example. Both chopping and auto-zeroing can extend the time that the data-converter is powered up, and hence increase the duty, cycle.

In an existing approach to offset cancellation in a multi-stage ADC circuit, the offset of the signal conditioning circuit, e.g., buffer circuit, coupled to an input of the multi-stage ADC circuit can be auto-zeroed. Then, the analog input signal can be sampled.

The first stage of the multi-stage ADC circuit can perform a coarse conversion on the sampled analog input signal to generate an output, e.g., the most significant bits (MSBs) and a residue signal. The residue signal is the difference between a feedback DAC output, which converts the coarse conversion output (MSBs) to an analog signal, and the sampled analog input signal. The residue signal can be amplified by a residue amplifier and transferred to the second stage of the multi-stage ADC circuit and the second stage can perform a fine conversion on the amplified residue signal to generate the remaining bits, e.g., the least significant bits (LSBs).

In the case of chopping, the two sampling phases can include the sum of two half samples, each with an opposite polarity of the offset of the signal conditioning circuit. As such, the total conversion time would be similar to the approach described above.

For a continuous running ADC, the signal conditioning circuit can perform auto-zeroing during one conversion (while the ADC is performing either a coarse conversion or a fine conversion, for example), and next apply the auto-zeroed signal conditioning circuit during the sampling phase of the next conversion. Hence, the algorithm can measure offset in one conversion, and correct for it in the next conversion. The offset therefore should be substantially constant between any two subsequent samples. Due to drift and lit noise, this condition fails when the time between two subsequent samples is too long, like in the case of convert on demand. In that case, the offset should be measured and eliminated within a conversion.

The present inventors have recognized a need to eliminate the extra time needed for offset cancellation in a multi-stage ADC circuit. Using various techniques of this disclosure, the on-time of the multi-stage ADC circuit can be reduced by combining the settling time of a signal conditioning circuit, e.g., buffer circuit, and the setting time of a residue amplifier when cancelling the offset of the signal conditioning circuit. As described in detail below, the techniques of this disclosure can allow the signal conditioning circuit and the residue amplifier to settle together.

Figure 1A:
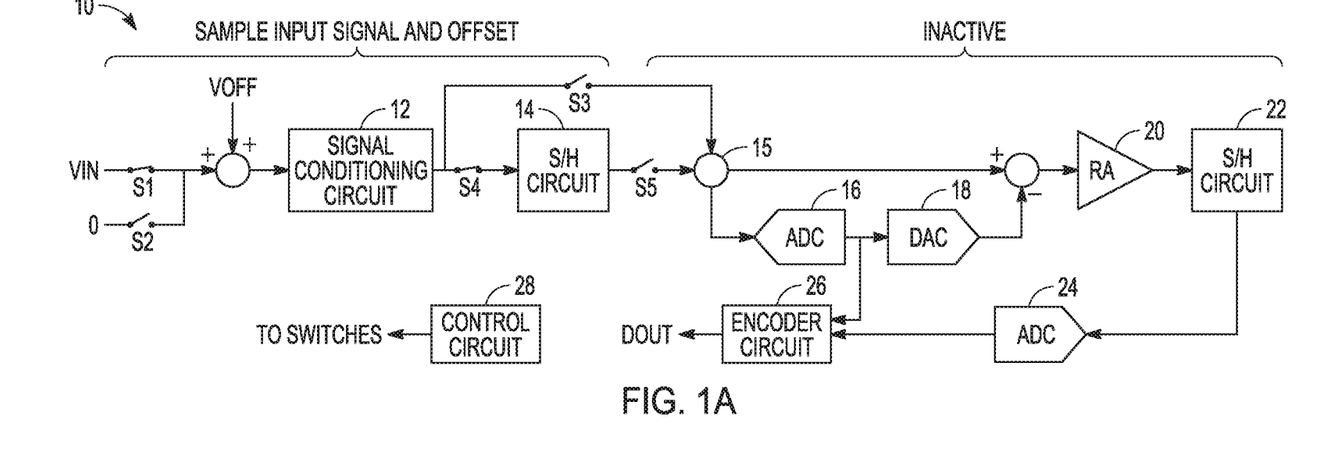
FIG. 1A is a conceptual block diagram of an example of a multi-stage ADC circuit during a first phase of an operation that can implement various techniques of this disclosure.

FIG. 1A is a conceptual block diagram of an example of a multi-stage ADC circuit 10 during a first phase of an operation that can implement various techniques of this disclosure. A signal conditioning circuit 12, e.g., buffer circuit, having an offset voltage Von is coupled to an input of the multi-stage ADC circuit 10 and is configured to receive and condition an analog input signal $V_{IN}$. The multi-stage ADC circuit 10 shown in FIG. 1A can include two stages. The first stage can include a first sample-and-hold circuit (S/H) 14, a first ADC sub-circuit 16, a first digital-to-analog converter (DAC) circuit 18, and a residue amplifier circuit 20. The second stage can include a second S/H circuit 22, a second ADC sub-circuit 24, and an encoder circuit 26. A control circuit 28 can control various operations of ADC circuit 10, including closing and opening switches S1-S5. The control circuit 28 can operate the switches S1-S5 to generate or establish a residue of the first conversion and eliminate, e.g., concurrently, the signal conditioning circuit offset from that residue.

Operation of the multi-stage ADC circuit 10 will now be briefly described, without specific reference to the first phase of operation. The first ADC sub-circuit 16 of the first stage can perform a first conversion, e.g., coarse conversion, on the sampled analog input signal to generate an output, e.g., the MSBs. A residue signal can be generated by subtracting the output of the first DAC circuit 18 from the sampled analog input signal $V_{IN}$. The residue signal can be amplified by the residue amplifier 20 and transferred to the second S/H circuit 22 of the second stage of the multi-stage ADC circuit 10. The second ADC sub-circuit 24 of the second stage can perform a second conversion, e.g., fine conversion, on the amplified residue signal to generate an output containing the remaining bits, e.g., the LSBs. The encoder circuit 26 can receive the output of the first ADC sub-circuit 16 (a first conversion result) and the output of the second ADC sub-circuit 24 (a second conversion result) and generate a digital output signal Dour.

During the first phase of operation, a control circuit 28 can close the switches S1 and S4, open the switches S2, S3, and S5, and the first S/H circuit 14, e.g., including one or more capacitors, can sample the analog input signal $V_{IN}$. The offset voltage $V_{OFF}$ of the signal conditioning circuit 12 is added to the analog input signal $V_{IN}$ and sampled. During sampling, the remaining circuitry of the multi-stage ADC circuit 10 can be inactive and, as such, consuming little to no power.

Figure 1B:
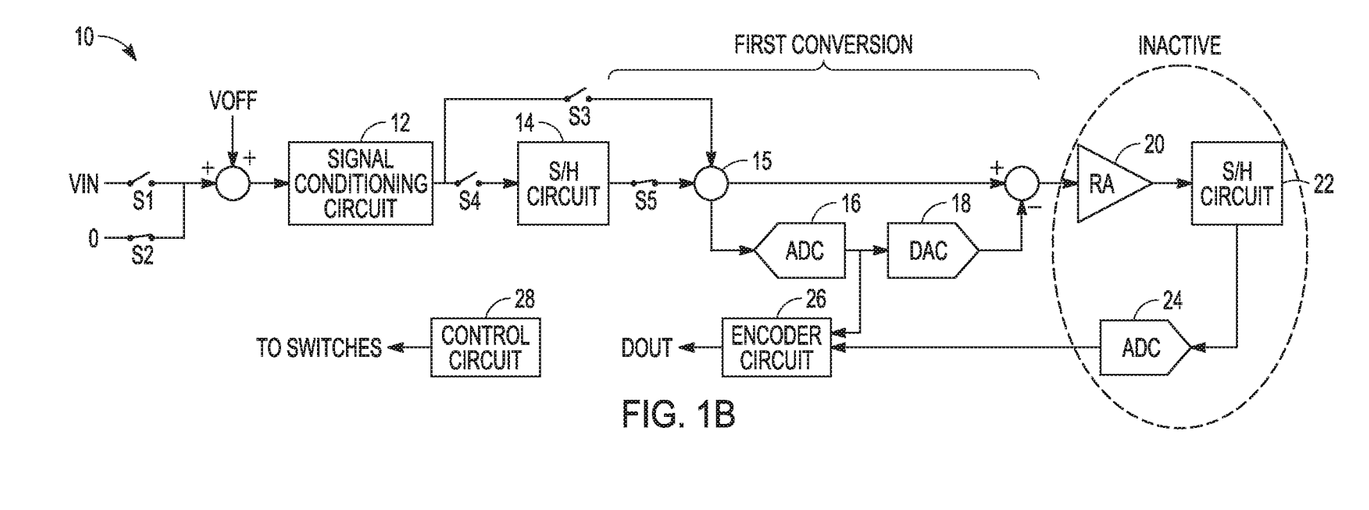
FIG. 1B is a conceptual block diagram of the multi-stage ADC circuit of FIG. 1A during a second phase of operation.

FIG. 1B is a conceptual block diagram of the multi-stage ADC circuit of FIG. 1A during a second phase of operation. During the second phase of operation, the control circuit 28 can open the switch S1 and close the switch S2 to couple the input of the signal conditioning circuit 12 to ground (if single-ended) to establish the offset $V_{OFF}$ of the signal conditioning circuit 12, and close the switch S5 to couple the first S/H circuit 14 to the first ADC sub-circuit 16. The first stage of the multi-stage ADC circuit 10 can perform a conversion, e.g., coarse conversion, on the combination of the sampled analog input signal $V_{IN}$ and the offset voltage $V_{OFF}$ associated with that sample and generate a first stage output. During this phase, one or more of the signal conditioning circuit 12, the residue amplifier 20, the second S/H circuit 22, the second ADC sub-circuit 24, and the encoder circuit 26 can be inactive and, as such, consume little to no power.

Figure 1C:
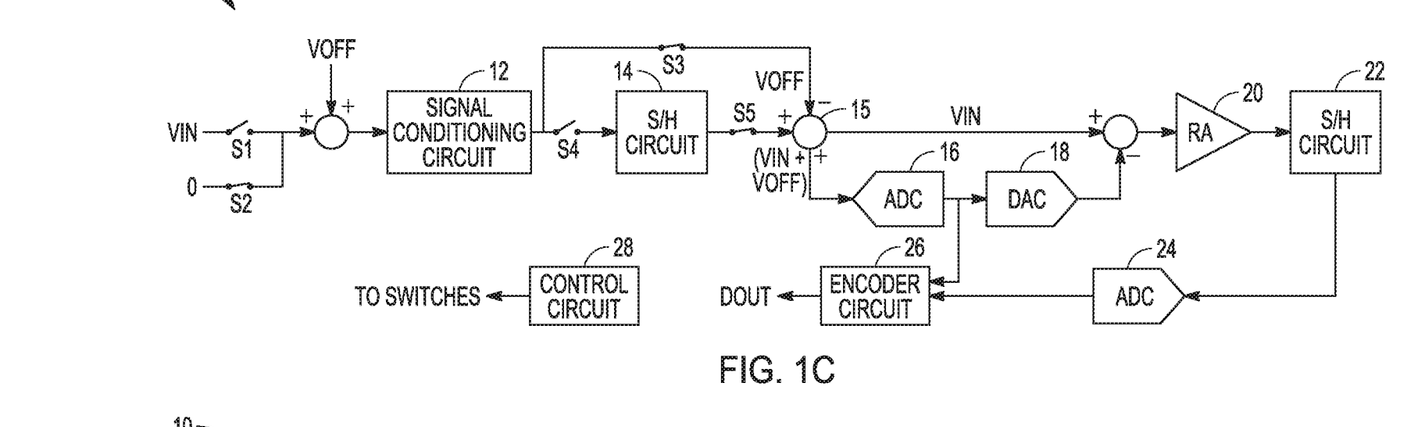
FIG. 1C is a conceptual block diagram of the multi-stage ADC circuit of FIG. 1A during a third phase of operation.

FIG. 1C is a conceptual block diagram of the multi-stage ADC circuit of IA during a third phase of operation. During this phase, the signal conditioning circuit 12, the first S/H circuit 14, the first DAC circuit 18, the residue amplifier 20, and the second S/H circuit 22 can be active, and the first ADC sub-circuit 16, the second ADC sub-circuit 24, and the encoder circuit 26 can be inactive. During the third phase of operation, the control circuit 28 can close the switch S3 to apply the offset voltage $V_{OFF}$ to the summing node 15. The offset voltage $V_{OFF}$ can be canceled by subtracting the offset voltage $V_{OFF}$ (from coupling the input of the signal conditioning circuit 12 to ground) from the sum of the sampled analog input signal $V_{IN}$ and the offset voltage $V_{OFF}$. For example, the summing node 15 can be configured to invert the offset input and the inverted offset voltage $V_{OFF}$ can be combined with the sum of the sampled analog input signal $V_{IN}$ and the offset voltage $V_{OFF}$. Then, the residue amplifier 20 can amplify the residue of the sampled analog input signal $V_{IN}$.

In this manner, the offset voltage $V_{OFF}$ can be canceled while the multi-stage ADC circuit 10 performs the residue amplification. The residue amplifier 20 takes time to amplify and the signal conditioning circuit takes time to settle. However, using the techniques described in this disclosure, the speed of the multi-stage ADC circuit can be improved because the time for the residue amplifier to amplify and the time for the signal conditioning circuit to settle happen concurrently rather than sequentially (as in other approaches). As such, the net time is the time of the residue amplifier to amplify.

Figure 1D:
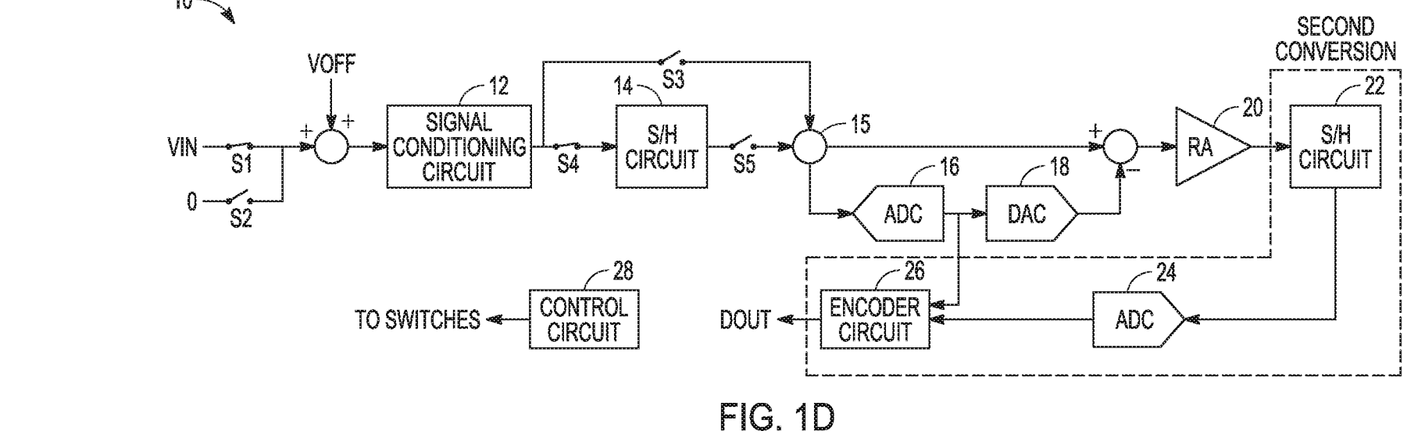
FIG. 1D is a conceptual block diagram of the multi-stage ADC circuit of FIG. 1A during a fourth phase of operation.

FIG. 1D is a conceptual block diagram of the multi-stage ADC circuit of FIG. 1A during a fourth phase of operation. During this phase, the second S/H circuit 22 and the second ADC sub-circuit 24 can be active while the other circuitry can be powered off. During the fourth stage of operation, the control circuit 28 can open the switch S3 and the second stage of the multi-stage ADC circuit 10 can perform a conversion, e.g., a fine conversion, on the residue of the sampled analog input signal $V_{IN}$ (and generate a second stage output). The encoder circuit 26 can receive the first stage output and the second stage output and generate a digital output $D_{OUT}$ that represents the sampled analog input signal $V_{IN}$. It should be noted that in some implementations, the second ADC sub-circuit 24 can be configured to accommodate an extra correction range for the offset that was added during the first stage of operation.

Although FIGS. 1A-1D were described with respect to a two-stage ADC circuit, the techniques of this disclosure are applicable to multi-stage ADC circuits having more than two stages. In multi-stage converters, there can be a second, a third, and more stages. There can be a second residue amplifier, that amplifies the second residue from the second stage. And a third ADC sub-circuit can perform a third conversion on the residue from the second stage. An encoder combines the outputs of all ADC sub-circuits stages and generates the digital output.

The first ADC sub-circuit 16 of the first stage can be implemented using various ADC circuit topologies. For example, the first ADC sub-circuit 16 can be a SAR ADC circuit configured to perform a conversion using a SAR algorithm. In other example implementations, the first ADC sub-circuit 16 can be a delta-sigma ADC circuit configured to perform a conversion using a delta-sigma algorithm. In other example implementations, the first ADC sub-circuit 16 can be a flash converter.

Similarly, the second ADC sub-circuit 24 of the second stage can be implemented using various ADC circuit topologies. For example, the second ADC sub-circuit 24 can be a SAR ADC circuit configured to perform a conversion using a SAR algorithm. In other example implementations, the second ADC sub-circuit 24 can be a delta-sigma ADC circuit configured to perform a conversion using a delta-sigma algorithm. In other example implementations, the second ADC sub-circuit 24 can be a flash converter.

In other example configurations, the first ADC sub-circuit 16 can be a hybrid ADC circuit configured to perform at least two algorithms selected from a group consisting of a successive approximation register (SAR) algorithm, a delta-sigma algorithm, and a flash algorithm. For example, the first ADC sub-circuit 16 can include both flash converter circuitry and SAR circuitry. Alternatively, or additionally, the second ADC sub-circuit can be configured as a hybrid ADC circuit.

Figure 2:
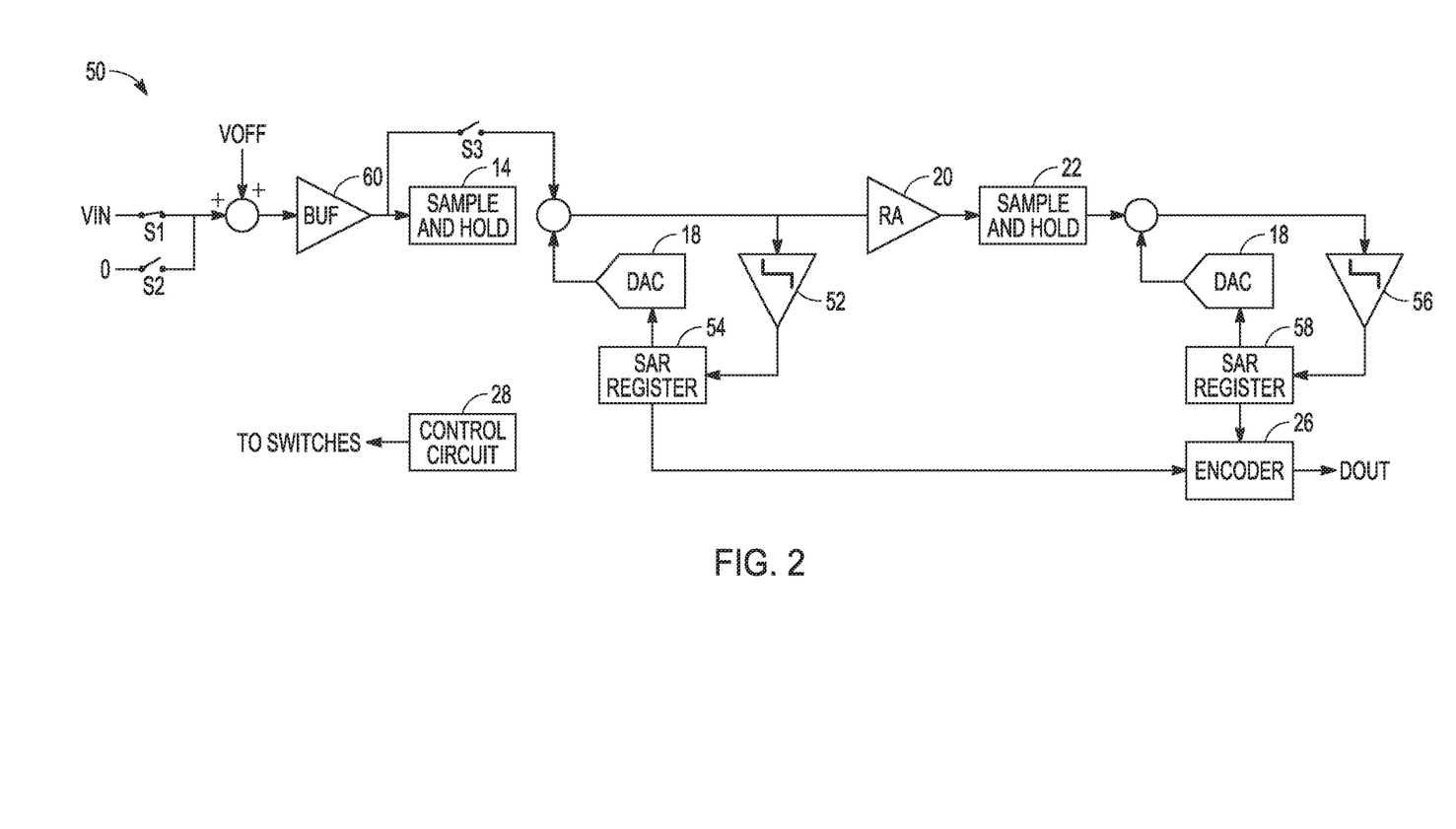
FIG. 2 is a conceptual block diagram of another example of a multi-stage ADC circuit that can implement various techniques of this disclosure.

FIG. 2 depicts a specific non-limiting multi-stage ADC circuit that can implement various techniques in this disclosure. In particular, the multi-stage ADC circuit of FIG. 2 utilizes SAR ADC sub-circuits.

FIG. 2 is a conceptual block diagram of another example of a multi-stage ADC circuit that can implement various techniques of this disclosure. The multi-stage ADC circuit 50 shown in FIG. 2 includes two stages, but the techniques are applicable to more than two stages. The multi-stage ADC circuit 50 of FIG. 2 can include components similar to those shown in FIGS. 1A-1D and are depicted with similar reference numbers.

The first stage can include a first sample-and-hold circuit (S/H) 14, a first SAR ADC sub-circuit including a first comparator circuit 52 and a first SAR register circuit 54, a first DAC circuit 18, and a residue amplifier circuit 20. The second stage can include a second S/H circuit 22, a second SAR ADC sub-circuit including a second comparator circuit 56 and a second SAR register circuit 58, and an encoder circuit 26. A buffer circuit 60, having an offset voltage $V_{OFF}$ and coupled to an input of the multi-stage ADC circuit 50, is configured to receive and buffer an analog input signal $V_{IN}$.

The multi-stage ADC circuit 50 shown in FIG. 2 can operate in several phases, such as described above with respect to FIGS. 1A-1D. In general, the phases can include sampling the analog input signal $V_{IN}$ without auto-zeroing the buffer circuit 60, performing a first conversion, e.g., coarse conversion, using the first SAR ADC sub-circuit, performing residue amplification of the sampled residue while cancelling the buffer offset, and performing a second conversion, e.g., fine conversion, using the second SAR ADC sub-circuit.

Figure 3:
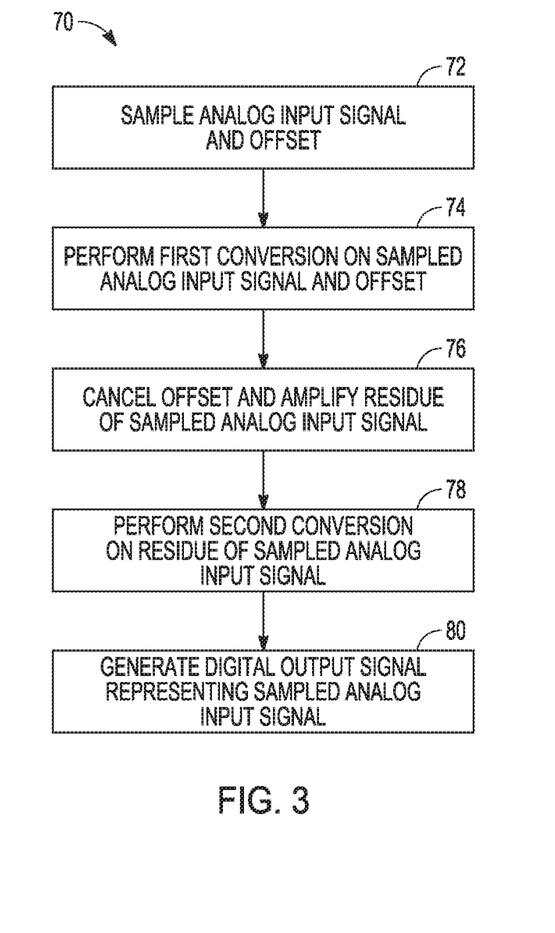
FIG. 3 is a flowchart of an example of a method of canceling an offset of a signal conditioning circuit coupled to an input of a multi-stage analog-to-digital converter (ADC) circuit using various techniques of this disclosure

FIG. 3 is a flowchart of an example of a method 70 of canceling an offset of a signal conditioning circuit coupled to an input of a multi-stage analog-to-digital converter (ADC) circuit using various techniques of this disclosure. At block 72, the method 70 can include sampling an analog input signal and the offset. For example, the control circuit 28 of FIG. 1A can close the switch S1 and the first S/H circuit 14 can sample the analog input signal $V_{IN}$ and the offset voltage $V_{OFF}$ of the signal conditioning circuit 12.

At block 74, the method 70 can include performing, by a first stage of the ADC circuit, a first conversion on the sampled analog input signal and offset $V_{OFF}$. For example, the control circuit 28 of FIG. 1B can open the switch S1 and close the switch S2 to couple the input of the signal conditioning circuit 12 to ground (if single-ended) to establish the offset $V_{OFF}$ of the signal conditioning circuit 12. The first stage of the multi-stage ADC circuit 10 can perform a conversion, e.g., coarse conversion, on the combination of the sampled analog input signal $V_{IN}$ and the offset voltage $V_{OFF}$ associated with that sample.

At block 76, the method 70 can include canceling the offset and amplifying a residue of the sampled analog input signal. For example, the offset voltage $V_{OFF}$ can be canceled by subtracting the offset voltage $V_{OFF}$ (from coupling the input of the signal conditioning circuit 12 to ground) from the sum of the sampled analog input signal $V_{IN}$ and the offset voltage $V_{OFF}$. Then, the residue amplifier 20 can amplify the residue of the sampled analog input signal $V_{IN}$.

At block 78, the method 70 can include performing, by a second stage of the ADC circuit, a second conversion on the residue of the sampled analog input signal. For example, the second stage of the multi-stage ADC circuit 10 of FIG. 1D can perform a conversion, e.g., a fine conversion, on the residue of the sampled analog input signal $V_{IN}$ (and generate a second stage output, or conversion result).

At block 80, the method 70 can include generating a digital output signal representing the sampled analog input signal. For example, the encoder circuit 26 of FIG. 1I) can receive the first stage output (first stage conversion result) and the second stage output (second stage conversion result) and generate a digital output $D_{OUT}$ that represents the sampled analog input signal $V_{IN}$.

Using the techniques described above, the speed of the multi-stage ADC circuit can be improved because the time for the residue amplifier to amplify and the time for the signal conditioning circuit to settle happen concurrently rather than sequentially (as in other approaches). Thus, the net time is the time of the residue amplifier to amplify.

NOTES

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of canceling an offset of a signal conditioning circuit coupled to an input of a multi-stage analog-to-digital converter (ADC) circuit, the method comprising:
    sampling an analog input signal and the offset;
    performing; by a first stage of the ADC circuit, a first conversion on the sampled analog input signal and offset;
    canceling the offset and amplifying a residue of the sampled analog input signal;
    performing, by a second stage of the ADC circuit, a second conversion on the residue of the sampled analog input signal; and
    generating a digital output signal representing the sampled analog input signal.

2. The method of claim 1, wherein canceling the offset comprises:
    shorting an input of the signal conditioning circuit to determine the offset; and
    subtracting the offset from the sampled analog input signal and offset.

3. The method of claim 1, wherein performing, by the first stage of the ADC circuit, the first conversion on the sampled analog input signal and offset includes:
    performing, by the first stage of the ADC circuit, the first conversion on the sampled analog input signal and offset using a successive approximation register (SAR) algorithm.

4. The method of claim 1, wherein performing, by the first stage of the ADC circuit, the first conversion on the sampled analog input signal and offset includes:

performing; by the first stage of the ADC circuit, the first conversion on the sampled analog input signal and offset using a delta-sigma algorithm.

5. The method of claim 1, wherein performing, by the first stage of the ADC circuit, the first conversion on the sampled analog input signal and offset includes:
performing; by the first stage of the ADC circuit, the first conversion on the sampled analog input signal and offset using a flash converter.

6. The method of claim 1, wherein performing, by the second stage of the ADC circuit, the second conversion on the residue of the sampled analog input includes:
performing; by the second stage of the ADC circuit; the second conversion on the residue of the sampled analog input using a successive approximation register (SAR) algorithm.

7. The method of claim 1, wherein performing, by the second stage of the ADC circuit, the second conversion on the residue of the sampled analog input includes:
performing, by the second stage of the ADC circuit, the second conversion on the residue of the sampled analog input using a delta-sigma algorithm.

8. The method of claim 1, wherein performing, by the second stage of the ADC circuit, the second conversion on the residue of the sampled analog input includes:
performing, by the second stage of the ADC circuit, the second conversion on the residue of the sampled analog input using a flash converter.

9. A multi-stage analog-to-digital converter (ADC) circuit having an input coupled to a signal conditioning circuit having an offset, the ADC circuit comprising:
a sample-and-hold circuit that samples an analog input signal and the offset;
a first stage including a first ADC sub-circuit that performs a first conversion on the sampled analog input signal and offset;
a control circuit that operates a plurality of switches to generate the residue of the first conversion and eliminate the signal conditioning circuit offset from the residue;
a residue amplifier that amplifies the residue of the sampled analog input signal;
a second stage including a second ADC sub-circuit that performs a second conversion on the residue of the sampled analog input signal; and
an encoder circuit that combines first and second conversion results and generate a digital output signal representing the sampled analog input signal.

10. The circuit of claim 9, wherein the first ADC sub-circuit includes a successive approximation register (SAR) ADC configured to perform a SAR algorithm.

11. The circuit of claim 9, wherein the first ADC sub-circuit includes a delta-sigma ADC that performs a delta-sigma algorithm.

12. The circuit of claim 9, wherein the first ADC sub-circuit includes a flash ADC that performs a flash algorithm.

13. The circuit of claim 9, wherein the second ADC sub-circuit includes a successive approximation register (SAR) ADC that performs a SAR algorithm.

14. The circuit of claim 9, wherein the second ADC sub-circuit includes a delta-sigma ADC that performs a delta-sigma algorithm.

15. The circuit of claim 9, wherein the second ADC sub-circuit includes a flash ADC configured that performs a flash algorithm.

16. The circuit of claim 9, wherein the first ADC sub-circuit and/or the second ADC sub-circuit is a hybrid ADC circuit that performs at least two algorithms selected from a group consisting of a successive approximation register (SAR) algorithm, a delta-sigma algorithm, and a flash algorithm.

17. The circuit of claim 9, wherein the signal conditioning circuit is a buffer circuit.

18. A multi-stage analog-to-digital converter (ADC) circuit having an input coupled to a signal conditioning circuit having an offset, the ADC circuit comprising:
a sample-and-hold circuit configured to sample an analog input signal and the offset;
means for performing, by a first stage of the ADC circuit, a first conversion on the sampled analog input signal and offset;
means for canceling the offset and amplifying a residue of the sampled analog input signal;
means for performing, by a second stage of the ADC circuit, a second conversion on the residue of the sampled analog input signal; and
means for generating a digital output signal representing the sampled analog input signal.

19. The circuit of claim 18, wherein the means for performing, by the first stage of the ADC circuit, the first conversion on the sampled analog input signal and offset includes a successive approximation register (SAR) ADC configured to perform a SAR algorithm.

20. The circuit of claim 18, wherein the means for performing, by the second stage of the ADC circuit, the second conversion on the residue of the sampled analog input signal includes a successive approximation register (SAR) ADC configured to perform a SAR algorithm.

* * * * *